US010112381B2

(12) United States Patent
Schadebrodt et al.

(10) Patent No.: US 10,112,381 B2
(45) Date of Patent: Oct. 30, 2018

(54) METHOD FOR PRODUCING FLEXOGRAPHIC PRINTING PLATES USING UV-LED IRRADIATION

(76) Inventors: Jens Schadebrodt, Mainz (DE); Armin Becker, Großniedesheim (DE); Uwe Stebani, Flörsheim-Dalsheim (DE); Maximilian Thate, Bad Dürkheim (DE)

( * ) Notice: Subject to any disclaimer, the term of this patent is extended or adjusted under 35 U.S.C. 154(b) by 1647 days.

(21) Appl. No.: 13/810,738

(22) PCT Filed: Jul. 12, 2011

(86) PCT No.: PCT/EP2011/061829
§ 371 (c)(1),
(2), (4) Date: May 30, 2013

(87) PCT Pub. No.: WO2012/010459
PCT Pub. Date: Jan. 26, 2012

(65) Prior Publication Data
US 2013/0242276 A1    Sep. 19, 2013

(30) Foreign Application Priority Data
Jul. 19, 2010 (DE) .................. 10 2010 031 527

(51) Int. Cl.
*B41C 1/10* (2006.01)
*G03F 1/68* (2012.01)
(Continued)

(52) U.S. Cl.
CPC ............ *B41C 1/1008* (2013.01); *G03F 1/68* (2013.01); *G03F 7/027* (2013.01); *G03F 7/11* (2013.01);
(Continued)

(58) Field of Classification Search
CPC .. B41C 1/1008; B41M 2205/14; G03F 7/027; G03F 7/11; G03F 7/2018; G03F 7/202; G03F 7/2024; G03F 7/325; G03F 7/36
See application file for complete search history.

(56) References Cited

U.S. PATENT DOCUMENTS 3,264,103 A   8/1966  Cohen et al.
5,061,606 A   10/1991 Telser et al.
(Continued)

FOREIGN PATENT DOCUMENTS

DE    202004017044 U1    1/2005
EP         332070 A2      9/1989
(Continued)

OTHER PUBLICATIONS

International Search Report for PCT/EP2011/061829 dated Nov. 8, 2011.
(Continued)

*Primary Examiner* — Steven H Whitesell Gordon
(74) *Attorney, Agent, or Firm* — Drinker Biddle & Reath LLP

(57) ABSTRACT

A method for producing flexographic printing plates, using a photopolymerizable flexographic printing element having, arranged one atop another, a dimensionally stable support, a photopolymerizable, relief-forming layer, an elastomeric binder, an ethylenically unsaturated compound, and a photoinitiator, and optionally a rough, UV-transparent layer, a particulate substance, and digitally imagable layer. The method includes: (a) producing a mask by imaging the digitally imagable layer, (b) exposing the photopolymerizable, relief-forming layer through the mask with actinic light, and photopolymerizing the image regions of the layer, and (c) developing the photpolymerized layer by washing out the unphotopolymerized regions of the relief-forming layer with an organic solvent, or by thermal development.

(Continued)

Step (b) includes (1) exposure with actinic light with an intensity of ≥100 mW/cm2 from a plurality of UV-LEDs and (2) exposure with actinic light with an intensity of <100 mW/cm2 from a UV radiation source other than UV-LEDs.

16 Claims, 3 Drawing Sheets

(51) Int. Cl.
  *G03F 7/20* (2006.01)
  *G03F 7/027* (2006.01)
  *G03F 7/11* (2006.01)
  *G03F 7/32* (2006.01)
  *G03F 7/36* (2006.01)

(52) U.S. Cl.
  CPC ............ *G03F 7/202* (2013.01); *G03F 7/2024* (2013.01); *G03F 7/325* (2013.01); *G03F 7/36* (2013.01); *B41M 2205/14* (2013.01); *G03F 7/2018* (2013.01)

(56) References Cited

U.S. PATENT DOCUMENTS

| | | |
|---|---|---|
| 5,175,072 A | 12/1992 | Martens |
| 5,262,275 A | 11/1993 | Fan |
| 5,354,645 A | 10/1994 | Schober et al. |
| 6,683,421 B1 | 1/2004 | Kennedy et al. |
| 6,931,992 B1 | 8/2005 | Hull et al. |
| 7,154,029 B2 | 12/2006 | Cahoon et al. |
| 2004/0234886 A1* | 11/2004 | Rudolph .................. G03F 7/11 430/204 |
| 2005/0130075 A1 | 6/2005 | Shaarawi et al. |
| 2005/0196701 A1* | 9/2005 | Rapp ........................ G03F 1/68 430/302 |
| 2010/0143840 A1 | 6/2010 | Veres et al. |
| 2011/0023739 A1* | 2/2011 | Yoshimoto ................ B41C 1/05 101/395 |
| 2011/0104615 A1* | 5/2011 | Sievers ................. G03F 7/2012 430/300 |

FOREIGN PATENT DOCUMENTS

| | | |
|---|---|---|
| EP | 433374 A1 | 6/1991 |
| EP | 654150 A1 | 5/1995 |
| EP | 0741330 A1 | 11/1996 |
| EP | 1069475 A1 | 1/2001 |
| EP | 1070989 A1 | 1/2001 |
| EP | 1072953 A1 | 1/2001 |
| EP | 1457823 A2 | 9/2004 |
| EP | 2275870 A1 | 1/2011 |
| JP | 2004-302447 A | 10/2004 |
| WO | WO-96/14603 A1 | 5/1996 |
| WO | WO-96/16356 A1 | 5/1996 |
| WO | WO-01/88615 A1 | 11/2001 |
| WO | WO-2008135865 A2 | 11/2008 |

OTHER PUBLICATIONS

International Preliminary Report on Patentability for PCT/EP2011/061829 dated Aug. 9, 2012.

* cited by examiner

METHOD FOR PRODUCING FLEXOGRAPHIC PRINTING PLATES USING UV-LED IRRADIATION

PRIORITY

Priority is claimed as a national stage application, under 35 U.S.C. § 371, to PCT/EP2011/061829, filed Jul. 12, 2011, which claims priority to German Application No. 10 2010 031 527.3, filed Jul. 19, 2010. Each disclosure of the aforementioned priority applications is incorporated herein by reference in its entirety.

BACKGROUND

The invention relates to a method for producing flexographic printing plates and also to apparatus suitable therefor.

The most widespread method for producing flexographic printing plates involves the imagewise exposure of the photopolymerizable, relief-forming layer with actinic radiation, especially longwave UV radiation, through a mask produced digitally or photographically. In a further method step, the exposed layer is treated using a suitable solvent or solvent mixture, with the unexposed, unpolymerized regions of the relief-forming layer being dissolved, while the exposed, polymerized regions are retained and form the relief of the printing plate.

Digital imaging of photosensitive flexographic printing elements is known in principle. In this context, flexographic printing elements are not produced conventionally, by placement of a photographic mask, followed by exposure through the photographic mask. Instead, the mask is produced in situ directly on the flexographic printing element by means of appropriate technologies. Flexographic printing elements may be provided, for example, with opaque, IR-ablative layers (EP-B 654 150, EP-A 1 069 475) which can be ablated imagewise by means of IR lasers. Other known technologies include layers which can be written by means of inkjet technology (EP-A 1 072 953), or layers which can be written thermographically (EP-A 1 070 989). Following the imagewise writing of these layers by means of the technologies appropriate for the purpose, the photopolymerizable layer is exposed through the resultant mask by means of actinic light.

Imagewise exposure with actinic radiation takes place on a standard basis using UV radiation sources which possess significant emission in the range from about 315 nm to 420 nm (longwave UV region to violet region of the visible spectrum). The most frequently used radiation source are UV/A tubes, which possess an emission maximum at a wavelength of about 370 nm and generate UV intensities of 10 mW/cm$^2$-30 mW/cm$^2$, measured at a distance of 50 mm (typical distance from the radiation source to the surface of the flexographic printing element). UV/A tubes of this kind are available for example under the "R-UVA TL 10R" designation from Philips.

Use is also made, moreover, of mercury vapor lamps for the imagewise exposure, with preference being given to doped medium-pressure mercury vapor lamps, since doping with iron and/or gallium allows an increase in the fraction emitted in the UV/A region. Units which comprise at least one mercury vapor lamp and also a reflector are referred to below as UV lamps. As well as the stated fractions of UV/A radiation, the emission spectrum of UV lamps also includes fractions of UV/B and UV/C radiation. In the course of imagewise exposure, these shorter-wave UV radiation fractions may lead to unwanted side-effects, such as, for example, to embrittlement of the irradiated surface or to the formation of ozone. Usually, therefore, medium-pressure mercury vapor lamps are selected for the imagewise exposure, where appropriate selection of the lamp glass greatly reduces the emission of UV/B and UV/C radiation. Furthermore, filters are also employed that substantially absorb the UV/B and UV/C radiation fractions, yet are substantially transparent to UV/A radiation. Since the majority of UV lamps available convert about 40% of the consumed electrical power into thermal radiation, the intensity of the UV lamps, which is actually high, cannot simply be transferred directly onto the substrate, since an excessive temperature load may damage the flexographic printing element. In order to reduce the thermal load on the substrate that is to be irradiated, the distance selected for the UV lamp to the substrate must be relatively large, 500 mm, for example, thereby reducing the UV intensity impinging on the substrate. By means of special reflectors and/or mirrors which are at least partly transparent to infrared radiation, but substantially reflect UV radiation, it is likewise possible to reduce the temperature load on the substrate that is to be irradiated. Nevertheless, it is usually not possible to realize UV/A intensities of >100 mW/cm$^2$ at the level of the flexographic printing element, since the element, as a result of the severe heating, will otherwise be damaged and additionally, in the case of flexographic printing elements with a PET film substrate, there is a risk of a loss of dimensional stability.

However, for the radiation curing of photopolymerizable compositions, there is also increasing use of LEDs (light emitting diodes) which emit UV light.

Common LED systems for UV curing are focused presently in practice on the wavelengths 395 nm and also 365 nm. Other possible spectral ranges are 350 nm, 375 nm, 385 nm, and 405 nm. Scientific publications additionally mention the wavelengths 210, 250 nm, 275 nm, and 290 nm. LEDs are distinguished by a narrow intensity distribution (typically +/−10-20 nm). They have no significant warm-up phase and can be regulated to about 10% to 100% of the maximum intensity.

Using UV light-emitting diodes it is possible to achieve power levels of a few watts/cm$^2$, and the efficiency, depending on LED-UV system, is between 1% and 20%. The rough rule of thumb here is as follows: the shorter the wavelength, the lower the efficiency. And the shorter the intended emission wavelength, the higher the production costs.

At the present time, LED systems for areal curing are available commercially with a wavelength of 395 nm and a UV power between 1-4 W/cm$^2$, and with a wavelength of 365 nm in the 0.5-2 W/cm$^2$ range, from various suppliers.

In order to allow quicker curing rates, the suppliers of LED units are currently boosting the UV output power at the expense of the efficiency. The currently most powerful LED units have an efficiency of around 8-12% at 395 nm, whereas a medium-pressure mercury lamp is located at 28% efficiency. The efficiency of a 365 nm LED unit is currently below 10%.

LED arrays are very expensive. The current price for an 8×1 cm UV-LED array is 5000-6000 euros. If the web width is doubled, then for an LED assembly there is also a doubling in the number of LEDS and hence also in the price. In the case of mercury vapor lamps, the price difference between different lamp lengths is smaller.

U.S. Pat. No. 6,683,421 discloses a device for the photocrosslinking of photoreactive materials, comprising (a) a housing, (b) a light-emitting semiconductor array mounted to the housing and capable of emitting light with a wavelength suitable for initiating photoreactions, (c) a power source for energizing the array to emit light, (d) a control unit coupled to the power source, for regulating the power supplied by the power source to the array, wherein (e) the array consists of a plurality of light-emitting semiconductors, and (f) the plurality of semiconductors is organized in a plurality of groups. No specific use applications are given for the apparatus described.

U.S. Pat. No. 6,931,992 discloses a system for exposing a photopolymerizable element with UV light, comprising a rotation means for rotatively moving the photopolymer, and a radiation source assembly arranged around the rotation means, the assembly comprising at least one radiation source which is able to deliver at least two different light emissions onto the photopolymer and which can be moved at least partly transverse to the direction of rotation and along the photopolymer, the different light emissions being arranged such that their rays overlap one another, in order to allow exposure of all points on the surface of the photopolymer continuously with at least one radiation source. Also described is a system for ablating a flexographic printing plate and carrying out exposure with UV light. Specific radiation sources identified are mercury plasma capillary lamps.

WO 2008/135865 describes a method comprising the positioning of a printing plate with photocrosslinkable material on an imaging unit, the imaging of the plate in accordance with image data, the application of UV radiation from a plurality of UV-emitting diodes for crosslinking the photocrosslinkable material on the plate during the imaging of the printing plate, where the printing plate may be a photopolymerizable flexographic printing plate, a photopolymerizable letter press printing plate, or a photopolymerizable sleeve. Additionally described is the removal of the plate from the imaging unit and its subsequent exposure from the reverse or from the front and optionally also from the reverse, with UV radiation from a plurality of UV-emitting diodes.

DE 20 2004 017 044 U1 discloses apparatus for exposing screen printing stencils, offset printing plates, flexographic printing plates or the like, having at least one light (1), having a transparent bearing plate (8) for an item intended for exposure, and having a means (10, 11) for moving the at least one light (1) backward and forward, the at least one light (1) being arranged at a small distance from the bearing plate (8), characterized in that the light (1) has at least one UV light-emitting diode (3).

During the exposure of photopolymer plates with UV light through a mask produced by laser ablation, an unwanted effect which occurs is the inhibition of the polymerization as a result of oxygen, which diffuses into the photopolymer layer from the surrounding atmosphere. The same effect occurs if a layer imagable digitally by means of other technologies is employed, since these layers are generally only a few micrometers thick and hence are sufficiently thin that the oxygen from the ambient air is able to diffuse through them.

When exposing the flexographic printing element through a photographic mask it is necessary to ensure that the negative is lying uniformly on the surface of the flexographic printing element, without air inclusions, since otherwise there may be instances of faulty exposure ("hollow copies"). On the photopolymerizable layer there is therefore usually a substrate layer which is less tacky than the surface of the photopolymerizable layer; on the other hand, it is usual to use film negatives having at least one rough film side. Lastly, by the application of reduced pressure (with the aid of a vacuum film, for instance), intimate contact between film negative and plate surface is produced, with the air present between them being very largely removed. Consequently the oxygen is no longer able to inhibit the photopolymerization. The most frequently used UV beam sources, namely UV/A tubes, possess a very diffuse light. Scattered light plays a significant part, promoted with a low UV intensity and the associated long exposure time. The UV/A light is scattered at the vacuum film and at all of the boundary faces (e.g., between film negative and plate surface). As a result, there may easily be a widening of positive elements that are to be imaged, while fine nonimage-region structures may be reduced in size.

Inhibition of polymerization by oxygen may also lead to severe element reduction, since, at the edges at least, the image elements no longer undergo sufficient polymerization and are ultimately removed by solvent, for example, in the course of the imagewise exposure. The result of this is what is called a reduction in tonal value—that is, the tonal value measured on the printing plate for a screen of positive elements (halftone dots) is smaller than the value corresponding to the image data. In certain circumstances this may be desirable, in order, for example, to compensate the increase in tonal value in the printing operation itself; on the other hand, below a certain tonal value, screen dots are no longer stably anchored and will no longer be imaged. As a result, gray gradations are lost and the tonal value range in the print is lower. The effect of tonal value reduction during the exposure of digital photographic printing plates is known according to the prior art with UV/A tubes. As a result of the polymerization-inhibiting effect of the oxygen during exposure, the polymerization of the halftone dots is disrupted, and so the halftone dots on the plate will be smaller than provided for in the data.

DESCRIPTION

Figure 1:
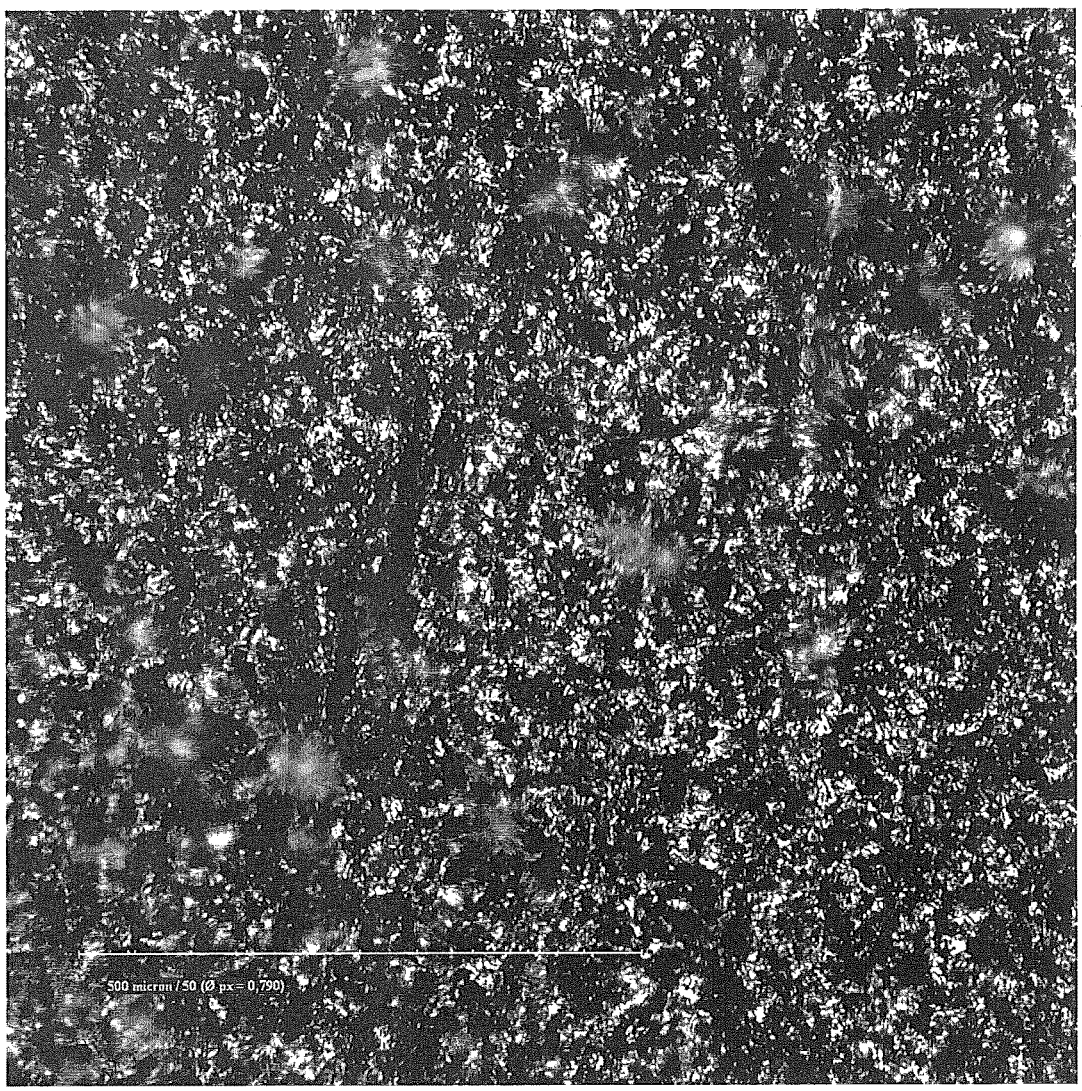
FIG. 1 is a photograph of the surface of a flexographic printing element with rough-surfaced, relief-forming layer, after ablation of the digitally imagable layer, but before exposure and development.

It is an object of the invention to provide an inexpensive method for producing flexographic printing plates that remedies the drawbacks of the prior art. The intention more particularly is to suppress the polymerization-inhibiting effect of the oxygen during the exposure of the photopolymerizable plate, substantially, and to suppress the associated deleterious consequences for the print outcome.

The object is achieved by a method for producing flexographic printing plates, using as starting material a photopolymerizable flexographic printing element which at least comprises, arranged one atop another, a dimensionally stable support, and at least one photopolymerizable, relief-forming layer, at least comprising an elastomeric binder, an ethylenically unsaturated compound, and a photoinitiator, a digitally imagable layer which is in direct contact with the photopolymerizable, relief-forming layer, and the method comprises at least the following steps:

(a) producing a mask by imaging the digitally imagable layer, (b) exposing the photopolymerizable, relief-forming layer through the mask with actinic light, and photopolymerizing the image regions of the layer, and (c) developing the photopolymerized layer by washing out the unphotopolymerized regions of the relief-forming layer with an organic solvent, or by thermal development, characterized in that step (b) comprises two exposure steps (b-1) and (b-2), where in a first step (b-1) exposure with actinic light takes place with an intensity of $\geq 100$ mW/cm$^2$ from a plurality of UV-LEDs and subsequently, in a second step (b-2), exposure takes place with actinic light with an intensity of <100 mW/cm$^2$ from a UV radiation source other than UV-LEDs.

In accordance with the invention, using a plurality of UV-LEDs for actinic light that are disposed in an array, an "initial exposure" is carried out for copy-precise imaging of elements on the surface of the photopolymerizable plate. The remaining "final exposure" for the fitting of the elements is carried out with other, more favorably priced radiation sources, such as with UVA tubes or UV lamps, for example.

The first exposure step is carried out preferably with an intensity of 150 mW/cm$^2$, more preferably with an intensity of 200 mW/cm$^2$, measured at the surface of the flexographic printing element.

It has emerged that the order of the exposure steps is essential. Accordingly, satisfactory outcomes are only achieved if exposure takes place first with a UV light source of high radiation intensity, followed by exposure with a more favorably priced UV light source of lower radiation intensity. The opposite order does not lead to satisfactory outcomes, since inhibition of the polymerization by oxygen, after having already taken place, can no longer be reversed by subsequent exposure with high-energy UV radiation—in that case, therefore, reproduction is no longer copy-precise.

If exposure is carried out exclusively using UV-LEDs, the difficulty arises of providing a stable anchoring to isolated, fine image elements, since there is no broadening of the image elements in deeper regions of the photopolymerizable layer. Exposure with conventional UV radiation sources, in contrast, leads to a broader anchoring of isolated image elements (dots or fine lines), since the light from UV tubes or UV lamps is more diffuse and hence less well directed, leading to a broadening of the image elements in the deeper-lying regions of the photopolymer layer. If the inhibitory effect of the oxygen at the surface is minimized by means of exposure using high-intensity UV-LEDs, it no longer plays virtually any part in the case of downstream exposure with UV tubes. The lower-lying regions of the photopolymer layer can then be exposed subsequently with a conventional UV light source (UV tube or UV lamp) and provided with good anchoring at the same time.

Generally speaking, the intensity of the UV LEDs used in accordance with the invention is $\geq 100$ mW/cm$^2$, preferably $\geq 150$ mW/cm$^2$, more preferably $\geq 200$ mW/cm$^2$, measured at the surface of the flexographic printing plate. Generally speaking, this intensity is not above 2000 mW/cm$^2$, preferably not above 1000 mW/cm$^2$.

The intensity at the level of the plate surface is measured using a suitable, calibrated UV measuring device, the sensor of the measuring device being placed at the same distance from the plate surface as the plate surface would be from the radiation source. Suitable UV measuring devices are available commercially from a variety of suppliers. Important factors here are that the measuring device is calibrated and sensitive within the UV wavelength range under test.

The distance between printing plate surface and UV radiation source in the first exposure step is typically 2 to 20 mm, preferably 2 to 10 mm. The radiation of the LEDs has virtually no IR fraction, and so a high intensity in combination with low distance from the substrate is possible, without a high thermal load on the substrate that is to be irradiated.

A high UV intensity in the first exposure step (b-1) minimizes the O2 inhibition of the photopolymerization and hence the extent of element reduction—in other words, there is only very slight copying size reduction of the image elements. Low copying size reduction may be desirable, since there may be an increase in tonal value in the print as a result of the printing procedure.

The radiation dose in the first exposure step (b-1) is generally from 1 to 8 J/cm$^2$, preferably from 1 to 5 J/cm$^2$. A minimal UV-LED dose is necessary, since if the UV-LED dose is small only the immediate surface will be crosslinked, but the layer fractions which connect the element anchors are too weakly crosslinked, which can lead to breakouts. This minimal UV-LED dose is approximately 0.5 J/cm$^2$.

In the second exposure step (b-2) a UV radiation source other than UV-LEDs, with a lower intensity, is used. Suitable radiation sources used in the second exposure step emit UV/A light, i.e., UV light in a range from 315-420 nm. Generally speaking, the emitted light has a broad intensity distribution. Suitable UV radiation sources used in the second exposure step are the above-described UV tubes and UV lamps. UV lamps are used generally at a greater distance (typically 500 mm) from the surface of the flexographic printing plate, owing to the higher level of heat developed, than are UV tubes (typically 50 mm).

Generally speaking, the intensity of the UV tube is $\geq 8$ mW/cm$^2$, preferably $\geq 10$ mW/cm$^2$, more preferably $\geq 12$ mW/cm$^2$. The intensity is generally not above 50 mW/cm$^2$, measured in each case at the surface of the flexographic printing element.

For example, the intensity of a UV tube is 10-30 mW/cm$^2$, measured at a distance of 50 mm. The intensity of a UV lamp is, for example, 50-60 mW/cm$^2$, measured at a distance of 500 mm.

The radiation dose in the second exposure step (b-2) is generally from 1 to 15 J/cm$^2$, preferably from 2 to 10 J/cm$^2$.

Generally speaking, 10% to 80% of the overall dose would be applied in the first exposure step (b-1), and 20% to 90% of the overall dose in the second exposure step (b-2). It is preferred to apply 15% to 50% of the overall dose in the first exposure step (b-1) and 50% to 85% of the overall dose in the second exposure step (b-2).

Suitable LEDs which can be used in the first exposure step (b-1) are the LEDs that are available commercially and known for UV curing. They have emission maxima in the wavelength range of 350-405 nm, as for example at 395 nm or 365 nm. Other possible emission wavelengths are 350 nm, 375 nm, 385 nm, and 405 nm. Preferred commercial LED systems used in accordance with the invention are those having wavelengths of 375 and 365 nm.

In accordance with the invention, the first exposure step (b-1) takes place with a plurality of UV LEDs which are disposed generally in an array. Hence an array of this kind may consist of a plurality of square LED modules disposed adjacent to one another, with each of the modules comprising a plurality—for example, 5×5—individual LEDs.

The first exposure step (b-1) may also take place with a plurality of such LED arrays. Exposure takes place generally with the photopolymerizable flexographic printing element being transported through beneath the exposure units (LED array or UV tube or UV lamp). It is of course also possible for the exposure units to be moved.

When producing cylindrical flexographic printing plates, it is also possible to use what are called allround exposure systems, which then comprise one or more LED arrays and one or more UV tubes.

Generally speaking, the flexographic element is subjected to preliminary exposure from the reverse. For this purpose, before step (b) is performed, the layer of photopolymerizable material is pre-exposed with actinic light through the UV-transparent support film, from the reverse of the photopolymerizable flexographic printing element. Preliminary reverse exposure is carried out preferably in the case of flexographic printing elements having a thickness of 1 mm, this figure relating to the sum total of dimensionally stable support film and photopolymerizable layer.

Generally speaking, preliminary reverse exposure takes place with a UV tube or a UV lamp, preferably of the same type also used in exposure step (b-2).

The photopolymerizable flexographic printing element used as starting material comprises—arranged atop one another—at least
  a dimensionally stable support, and
  at least one photopolymerizable, relief-forming layer, at least comprising an elastomeric binder, an ethylenically unsaturated compound, and a photoinitiator,
  a layer imagable digitally by laser ablation.

Examples of suitable dimensionally stable supports for the photopolymerizable flexographic printing elements used as starting material for the method are sheets, films, and also conical and cylindrical sleeves made of metals such as steel, aluminum, copper, or nickel, or of plastics such as polyethylene terephthalate (PET), polyethylene naphthalate (PEN), polybutylene terephthalate (PBT), polyamide, polycarbonate, optionally also woven and nonwoven fabrics, such as woven glass fiber fabric, and also composite materials, comprising glass fibers and plastics for example. Dimensionally stable supports contemplated include, in particular, dimensionally stable support films such as, for example, polyester films, more particularly PET or PEN films, or flexible metallic supports, such as thin sheets or metal foils made of steel, preferably of stainless steel, magnetizable sprung steel, aluminum, zinc, magnesium, nickel, chromium, or copper.

If preliminary reverse exposure of the flexographic printing element is to be carried out, the dimensionally stable support must be transparent to UV light. Preferred supports are plastics films made from PET or other polyesters.

The flexographic printing element further comprises at least one photopolymerizable, relief-forming layer. The photopolymerizable, relief-forming layer may be applied directly on the support. Between the support and the relief-forming layer, however, there may also be other layers, such as adhesion layers and/or resilient underlayers.

Between the support film, optionally coated with an adhesion layer, and the photopolymerizable, relief-forming layer there may be an elastomeric support layer. The support layer may optionally be photochemically crosslinkable.

The photopolymerizable, relief-forming layer comprises at least one elastomeric binder, an ethylenically unsaturated compound, a photoinitiator or a photoinitiator system, and also, optionally, one or more further components, examples being plasticizers, processing assistants, dyes, and UV absorbers.

Elastomeric binders for producing flexographic printing elements are known to the skilled person. Both hydrophilic and hydrophobic binders may be used. Examples include styrene-diene block copolymers, ethylene-acrylic acid copolymers, polyethylene oxide-polyvinyl alcohol graft copolymers, natural rubber, polybutadiene, polyisoprene, styrene-butadiene rubber, nitrile-butadiene rubber, butyl rubber, styrene-isoprene rubber, styrene-butadiene-isoprene rubber, polynorbornene rubber, or ethylene-propylene-diene rubber (EPDM). It is preferred to use hydrophobic binders. Binders of this kind are soluble or at least swellable in organic solvents, whereas in water they are largely insoluble and are also not swellable, or at least not substantially swellable, in water.

The elastomer is preferably a thermoplastically elastomeric block copolymer of alkenylaromatics and 1,3-dienes. The block copolymers may be linear, branched, or radial block copolymers. Typically they are triblock copolymers of the A-B-A type, but may also be diblock polymers of the A-B type, or copolymers having two or more alternating elastomeric and thermoplastic blocks, e.g., A-B-A-B-A. Use may also be made of mixtures of two or more different block copolymers. Commercial triblock copolymers frequently include certain fractions of diblock copolymers. The diene units may be 1,2- or 1,4-linked. Not only block copolymers of the styrene-butadiene or styrene-isoprene type but also those of the styrene-butadiene-isoprene type may be used. They are available commercially under the name Kraton®, for example. Additionally it is possible as well to use thermoplastically elastomeric block copolymers having end blocks of styrene and a random styrene-butadiene middle block, these copolymers being available under the name Styroflex®. The block copolymers may also be wholly or partly hydrogenated, such as in SEBS rubbers, for example.

Elastomeric binders present very preferably in the photopolymerizable, relief-forming layer are triblock copolymers of the A-B-A type or radial block copolymers of the $(AB)_n$ type, in which A is styrene and B is a diene.

Elastomeric binders present very preferably in an elastomeric support layer are triblock copolymers of the A-B-A type, radial block copolymers of the $(AB)_n$ type, in which A is styrene and B is a diene, and also random copolymers and statistical copolymers of styrene and of diene.

It is of course also possible to use mixtures of two or more binders, subject to the proviso that this does not adversely affect the properties of the relief-forming layer.

The total amount of binders in the case of the relief-forming layer is typically 40% to 90% by weight, relative to the sum of all of the constituents of the relief-forming layer, preferably 40% to 80% by weight, and more preferably 45% to 75% by weight.

In the case of an optionally present elastomeric support layer, the total amount of elastomeric binders may be up to 100% by weight. Typically it is 75% to 100% by weight, preferably 85% to 100% by weight, and more preferably 90% to 100% by weight.

The photopolymerizable, relief-forming layer further comprises, in a known way, at least one ethylenically unsaturated compound which is compatible with the binders. Suitable compounds have at least one ethylenically unsaturated double bond and are polymerizable. They are therefore referred to below as monomers. Having proven particularly advantageous are esters or amides of acrylic acid or of methacrylic acid with mono- or polyfunctional alcohols, amines, amino alcohols or hydroxylethers and hydroxyl esters, esters of fumaric or maleic acid, vinyl ethers, vinyl esters, or allyl compounds. Examples of suitable monomers are butyl acrylate, 2-ethylhexyl acrylate, lauryl acrylate, tetradecyl acrylate, 1,4-butanediol diacrylate, 1,6-hexanediol diacrylate, 1,6-hexanediol dimethacrylate, 1,9-nonanediol diacrylate, trimethylolpropane tri(meth)acrylate, dioctyl fumarate, and N-dodecylmaleimide. Very preferred monomers are mono-, di-, and tri-acrylates and -methacrylates. It is of course also possible to use mixtures of two or more different monomers. The nature and amount of the monomers are selected by the skilled person according to the desired properties of the layer. The amount of monomers in the photopolymerizable, relief-forming layer a) is generally not more than 20% by weight, relative to the amount of all constituents, and in general is between 3% and 15% by weight.

In a way which is known in principle, the photopolymerizable, relief-forming layer further comprises at least one photoinitiator or a photoinitiator system. Examples of suitable initiators are benzoin or benzoin derivatives, such as methylbenzoin or benzoin ethers, benzil derivatives, such as benzil ketals, acylarylphosphine oxides, acrylarylphosphinic esters, α-hydroxy ketones, polycyclic quinones, or benzophenones. The amount of photoinitiator in the relief-forming layer is generally 0.1% to 5% by weight, relative the amount of all of the constituents of the relief-forming layer.

The elastomeric support layer may likewise comprise the aforementioned ethylenically unsaturated compounds and the aforementioned photoinitiators, and preferably does comprise them, and is therefore photopolymerizable like the relief-forming layer. Generally speaking, the amount of ethylenically unsaturated compounds in the support layer is 0% to 15% by weight. In general the amount of photoinitiator in the support layer is 0% to 5% by weight.

The relief-forming layer and optionally the optional elastomeric support layer may comprise plasticizers. Mixtures of different plasticizers can be used as well. Examples of suitable plasticizers include modified and unmodified natural oils and natural resins, such as high-boiling paraffinic, naphthenic, or aromatic mineral oils, synthetic oligomers or resins such as oligostyrene, high-boiling esters, oligomeric styrene-butadiene copolymers, oligomeric α-methylstyrene/p-methylstyrene copolymers, liquid oligobutadienes, more particularly those having a molecular weight of between 500 and 5000 g/mol, or liquid oligomeric acrylonitrile-butadiene copolymers or oligomeric ethylene-propylene-diene copolymers. Preference is given to polybutadiene oils, more particularly those having a molecular weight of between 500 and 5000 g/mol, high-boiling aliphatic esters such as, more particularly, esters of alkylmonocarboxylic and dicarboxylic acids, examples being stearates or adipates, and mineral oils. The amount of an optionally present plasticizer is determined by the skilled person in accordance with the desired properties of the layer. In general it will not exceed 50% by weight of the sum total of all of the constituents of the photopolymerizable, relief-forming layer; in general it is 0% to 50% by weight, preferably 0% to 40% by weight.

The thickness of the relief-forming layer is generally 0.3 to 7 mm, preferably 0.5 to 6 mm.

One preferred embodiment uses a binder of the styrene-butadiene type. Particularly preferred binders are linear, radial, or branched block copolymers of the styrene-butadiene type. These block copolymers have an average molecular weight $M_w$ (weight average) of 80 000 to 250 000 g/mol, preferably 80 000 to 150 000 g/mol, and more preferably of 90 000 to 130 000 g/mol, and have a styrene content of 20% to 40% by weight, preferably 20% to 35% by weight, and more preferably of 20% to 30% by weight.

In another preferred embodiment of the invention, the binder is of the styrene-isoprene type. Preferred binders of the styrene-isoprene type contain generally 13% to 40%, preferably 13% to 35%, and more preferably from 14% to 30% by weight of styrene.

The photopolymerizable flexographic printing elements can be produced by methods known in principle to the skilled person, as for example by melt extrusion, casting or laminating in a single stage or multistage production procedure. Preference is given to their production by means of melt extrusion, where first of all the constituents of the relief-forming layer are mixed with one another in an extruder, with heating. For producing sheetlike flexographic printing elements, the photopolymerizable composition can be discharged from the extruder through a slot die between two films, and the layer assembly can be calendered, the nature of the films being guided by the desired end use. The films in question are films which exhibit good adhesion to the photopolymerizable layer, or are readily removable (temporary) films. For the production of sheetlike flexographic printing elements it is usual to use a well-adhering support film and a removable top film. The thickness of the photopolymerizable layer is generally 0.4 to 7 mm, preferably 0.5 to 4 mm, and more preferably 0.7 to 2.5 mm.

The imaging of the digitally imagable layer is performed by means of digital masks. Masks of this kind are also known as in situ masks. For this purpose, a digitally imagable layer is first applied to the photopolymerizable, relief-forming layer. The digitally imagable layer is preferably an IR-ablative layer, inkjet layer or layer which can be written thermographically.

The digitally imagable layer is preferably a layer which can be ablated using an IR laser (IR-ablative layer).

IR-ablative layers and masks are opaque to the wavelength of actinic light and typically comprise at least one binder, an IR absorber such as carbon black, for example, and also an absorber for UV radiation; the function of the IR absorber and UV absorber may also be performed by just one substance, as is the case, for example, when carbon black is used as IR absorber, since in sufficient concentration carbon black renders the mask layer substantially opaque to UV light. A mask can be written into the IR-ablative layer by means of an IR laser—in other words, at the points at which it is struck by the laser beam, the layer is decomposed and ablated. Irradiation can take place imagewise with actinic light through the resultant mask. Examples of the imaging of flexographic printing elements with IR-ablative masks are disclosed in EP-A 654 150 or EP-A 1 069 475, for example.

In the case of inkjet layers, a layer which can be written with inkjet inks, such as a gelatin layer, is applied. This layer is imagable by means of inkjet printers. Examples are disclosed in EP-A 1 072 953.

Thermographic layers are layers comprising substances which turn black in color under the influence of heat. Layers of this kind comprise, for example, a binder and an organic silver salt, and can be imaged by means of a printer with a thermal head or by means of IR lasers. Examples are disclosed in EP-A 1 070 989.

In one particular embodiment of the method of the invention there is a rough, UV-transparent layer, which comprises a particulate substance, between the photopolymerizable, relief-forming layer and the digitally imagable layer. As a result of the particulate substance, small elevations or indentations are produced in the printing surface, and improve ink transfer in the printing operation.

The flexographic printing element therefore comprises, arranged one atop another, at least
  a dimensionally stable support, and
  at least one photopolymerizable, relief-forming layer, at least comprising an elastomeric binder, an ethylenically unsaturated compound, and a photoinitiator,
  a rough, UV-transparent layer, at least comprising a particulate substance,
  a digitally imagable layer.

The particulate substance present in the UV-transparent layer either is anchored in the relief-forming layer, and hence produces elevations on the relief-forming layer, or the particulate substance is not anchored, and it leaves, in the relief-forming layer, indentations whose size is of the order of the particle diameter of the particulate substance. Generally speaking, the particulate substance has an average particle diameter of 0.5 to 50 µm.

The rough, UV-transparent layer is located in direct and intimate contact with the photopolymerizable relief layer, and hence the roughness is transferred to the printing surface of the flexographic printing element.

In a first embodiment the rough substrate layer comprises
a) at least one polymeric binder, and
b) at least one particulate substance having an average particle diameter of 0.5-50 µm.

If the flexographic printing element is developed by means of a washing agent, with the nonimage regions of the flexographic printing element being removed with a suitable solvent or solvent mixture, the polymeric binder is soluble or at least dispersible in the washing agent. If the flexographic printing element is developed thermally, with the nonimage regions being liquefied such that they can be taken up by a suitable absorbent material, the polymeric binder can be liquefied at the processing temperature to an extent such that it becomes fluid and can be taken up by the absorbent material.

Suitable binders include polyamides, examples being nylon and copolymers of nylon, polyvinyl alcohols, polyurethanes, urethane copolymers, polyvinylpyrrolidone, polyethylene oxides having a number-average molecular weight of ≥100 000 g/mol, ethylene-vinyl acetate copolymers, polyacrylates, polyesters, cellulose esters, cellulose ethers, and polyolefins.

The particulate substance may produce indentations in the photopolymerizable relief layer, as a result of impression, or, by being anchored on the photopolymerizable relief layer, it may form elevations on the photopolymerizable relief layer.

The anchoring of the particulate substance on the photopolymerizable relief layer may take place physically or chemically. Physical anchoring can be brought about, for example, by the particulate substance having a very irregular shape or possessing a large number of small open pores. In that case, while it is in direct contact with the rough, UV-transparent layer, the photopolymerizable layer is able to penetrate the cavities or pores in the particulate substance, thus producing, after polymerization, a mechanical anchoring. Chemical anchoring of the particulate substance on the photopolymerizable relief layer may be accomplished, for example, by means of functional groups on the particle surface. Suitable functional groups include ethylenically unsaturated groups or other groups reactive with free radicals, such as allyl groups, amino groups, vinylsilane groups, vinylsiloxane groups, or halogen groups.

As described in EP 1457823 A2, the particulate substance generally possesses an average particle size of ≥3 µm in accordance with ASTM D 4483-85. It is preferred for 60 percent by weight of the particulate substance to have a particle size of 3 to 15 µm.

The framework of the particulate substance is preferably inorganic in nature. Suitable particulate substances comprise matting agents having
i) a pore volume of 0.9 ml/g or
ii) a BET surface area of ≥150 $m^2$/g or
iii) an oil number of ≥150 g/100 g,
and it is also possible for two or three of the stated conditions to be met. Further suitable particulate substances are silicas and silica gels, finely disperse silicon dioxide, zeolites, and pigments in the particle sizes described.

For anchoring the particulate substance on the surface of the photopolymerizable layer, the stated suitable substances may be functionalized with the aforementioned functional groups, the functionalization being present generally only on the surface of the particles.

In a second embodiment, the rough, UV-transparent layer comprises not only the particulate substance but also at least one wax. In this case, the rough substrate layer is produced advantageously by application of a polymeric wax dispersion to the digitally imagable layer. It is preferred not to add any further binder to the wax.

Between the digitally imagable layer and the rough, UV-transparent layer there may optionally also be intermediate layers, an example being an adhesion-promoting layer.

With the conventional prior-art exposure of a digitally imaged flexographic printing element which has an additional rough, UV-transparent layer, with UV tubes or UV lamps, the oxygen that is present and that diffuses into the photopolymerizable, relief-forming layer has an inhibiting effect on the polymerization, and does so most strongly directly beneath the surface of the flexographic printing element. More particularly, an upper layer region, to a depth of about 30 µm, of the flexographic printing element is incompletely polymerized, and in the course of the subsequent development, by washing with solvents or by thermal development, is removed along with the nonimage regions. As a result of this, the roughness of the rough, UV-transparent layer, present in the form of indentations or in the form of anchored particles, and imaged onto the printing surface is largely lost. There then remain on the printing surface only very flat structures, which may have a wormlike appearance, and whose dimensions no longer coincide with the defined particle sizes of the particulate substance.

If the exposure method of the invention is employed, the high intensity of the first exposure step at least greatly reduces the inhibiting effect of the oxygen. As a result, the roughness applied to the surface of the photopolymerizable, relief-forming layer by the rough, UV-transparent layer is substantially retained. A uniformly rough surface of the printing regions is advantageous (increasing the masstone density) in terms of uniformity and amount of the ink transferred to the print medium.

The method of the invention can be carried out by inserting the starting material first into a receiving unit, by means, for example, of placing it onto a conveyor belt or charging the magazine. If the starting material has a protective sheet, then, unless the receiving unit has an automatic removal means, said sheet must be removed.

In the method step (a), the digitally imagable layer is imaged in an imaging unit by means of the technology requisite in each case. The image information is taken directly from a control unit.

In the method step (b), the imaged flexographic printing element is irradiated by means of the exposure unit through the mask that has been produced, using actinic light—that is, chemically active light.

In a method step (c), the imagewisely imaged and exposed flexographic printing element is developed by means of a suitable solvent or solvent combination. In this case the unexposed regions, i.e., those covered by the mask, in the relief layer are removed, while the exposed—i.e., cross-linked—regions are retained. Moreover, the remainders of the digitally imagable layer are removed.

The solvent or solvent mixture used is guided by the nature of the flexographic printing element employed. If the flexographic printing element has an aqueously developable photopolymerizable layer, then water or predominantly aqueous solvents can be used. In the case of organically developable flexographic printing elements, particular suitability is possessed by the known washing agents for flexographic printing plates, consisting typically of mixtures of different organic solvents which interact in an appropriate way. For example, use may be made of developers comprising naphthenic or aromatic petroleum fractions in a mixture with alcohols, such as benzyl alcohol, cyclohexanol, or aliphatic alcohols having 5 to 10 carbon atoms, for example, and also, optionally, further components, such as, for example, alicyclic hydrocarbons, terpenoid hydrocarbons, substituted benzenes such as diisopropylbenzene, esters having 5 to 12 carbon atoms, or glycol ethers, for example. Suitable washing agents are disclosed in EP-A 332 070 or EP-A 433 374, for example.

The developing step is carried out typically at temperatures above 20° C. For reasons of safety and to reduce the cost and complexity of the developing apparatus involved, the temperature when using organic solvents ought to be 5° C. to 15° C. beneath the flash point of the washing agent mixture used.

The flexographic printing plates can be dried in a method step (d). Where the flexographic printing element has a PET film support, drying takes place preferably at a temperature of 40 to 80° C., more preferably at 50 to 70° C. Where the dimensionally stable support of the flexographic printing element is a metal support, drying may also take place at higher temperatures, up to around 160° C.

In a method step (e), the resultant flexographic printing plates may where necessary be subjected additionally to a detackifying aftertreatment by means of UV-A and/or UV-C light. Generally speaking, such a step is advisable. If irradiation is to take place with light of different wavelengths, this may occur simultaneously or else in succession.

Between the individual method steps, the flexographic printing element or flexographic printing plate is transported on from one unit to the next. The flexographic printing element or flexographic printing plate does not have to be bent in any of the method steps; instead, all of the steps are traversed with the flexographic printing element or plate in planar form.

Development may also be accomplished by thermal means. In the case of thermal development, no solvent is used. Instead, following imagewise exposure, the relief-forming layer is brought into contact with an absorbing material and heated. The absorbing material comprises, for example, a porous nonwoven, made of nylon, polyester, cellulose, or inorganic materials, for example. In the course of the thermal development, the flexographic printing element, at least on the surface, experiences an increase in temperature such that the unpolymerized fractions of the relief-forming layer are able to turn liquid and be taken up by the absorbing material. The used absorbing material is then removed. Details relating to thermal development are disclosed by U.S. Pat. No. 3,264,103, U.S. Pat. No. 5,175,072, WO 96/14603, or WO 01/88615, for example. The mask may optionally be removed beforehand by means of a suitable solvent or likewise thermally.

Further provided by the present invention is apparatus for inline production of flexographic printing plates by means of digital imaging, at least comprising:

(A) optionally a unit for digitally imaging the flexographic printing element,
(B) a first exposure unit, comprising a plurality of LEDs arranged in an array and capable of emitting UV light with an intensity of ≥100 mW/cm$^2$,
(C) a second exposure unit, comprising at least one UV radiation source other than LEDs, preferably a UV tube or a UV lamp,
(D) a washing unit,
(E) a drying unit,
(F) optionally an aftertreating unit,
(G) optionally a delivery unit for the resulting flexographic printing plates, and
(H) transport units for the flexographic printing elements and plates, connecting the units (B) to (E) with one another.

The units (A) to (H) are preferably designed so that the flexographic printing elements and plates are processed in a planar state.

Unit (A) serves for digital imaging of the flexographic printing element. It may comprise two or more functional units of the same kind, examples being IR lasers or inkjet printheads for digital imaging. It may have, for example, 5 to 50 functional units. The interaction of a relatively large number of functional units allows more rapid imaging of the flexographic printing element to be achieved. As a result of the action of the functional units on the digitally imagable layer of the flexographic printing element, a mask is produced on the flexographic printing element. This step is frequently carried out separately in a unit separate from the apparatus featuring units (B) to (H).

The functional units are typically disposed above the flexographic printing element, and so are able to image the digitally imagable layer as far as possible vertically from above. For the purpose of imaging, it must also be possible for there to be a relative movement between the functional units and the flexographic printing element that is to be imaged. For this purpose, the plate, the functional units, or both may be moved. It would also be possible, however, for there to be, for example, a fixed laser source with only the laser beam being guided, by way of a system of mirrors, for example.

The nature of the functional units is guided by the nature of the digitally imagable layer. For the imaging of flexographic printing elements with opaque, IR-ablative layers, IR lasers are used. These are preferably diode lasers, without any intention that the invention should be restricted to such lasers. In that case the opaque, IR-ablative layer is removed at the locations at which it is struck by a laser beam, and the underlying photopolymerizable layer is exposed. In order to prevent the apparatus of the invention becoming contaminated with the breakdown products of the layer, the imaging unit, in the case of this embodiment, ought expediently to have a suction removal means.

Imaging by means of inkjet technology takes place in accordance with the converse principle. The digitally imagable layer is transparent, and those locations which are not to crosslink are masked using opaque ink. The functional units, accordingly, are inkjet printheads.

Thermographic, digitally imagingable layers are transparent and become opaque under the influence of heat. Suitable functional units for the writing of thermographic layers are IR lasers or thermal printheads, for example.

It is useful for the imaging unit (A) to have a modular construction, hence allowing the functional units to be easily switched according to the desired imaging technology.

The first exposure unit (B) comprises a plurality of LEDs arranged in an array. It may comprise two or more arrays of LEDs.

The second exposure unit (C) comprises at least one UV tube or a UV lamp of the type described above.

The washing unit (D) comprises means for treating the exposed flexographic printing element with a suitable washing agent, by spraying or immersion, for example. It further comprises typically moving brushes or pads for accelerating the removal of the unpolymerized polymer. Furthermore, the washing unit typically comprises suitable means for supplying fresh washing agent and for removing used washing agent.

The drying unit (E) serves for the drying of the wet flexographic printing element. It may consist, for example, of a heatable chamber or of a drying tunnel. Heat may be supplied, for example, by installed heating elements. However, the drying unit may advantageously also have a stream of hot drying gas passing through it. Naturally, it is also possible to combine the heating options with one another. The drier used ought to be an exhaust-air drier, in order to prevent the accumulation of solvent in the gas space. The solvent concentration in the gas space ought to be below the lower explosion limit. It is also possible, advantageously, to circulate a stream of drying gas, in which case washing agent which escaped from the flexographic printing plate is separated off in a means suitable for the purpose, and the depleted stream of drying gas is returned to the drying unit. The solvent can be removed by means, for example, of condensation at relatively low temperatures or absorption on suitable absorbers.

The aftertreating unit (F) is not necessary in every case, and is therefore only optional. Generally speaking, however, it is advisable for the surface detackifying of the resulting flexographic printing plate. The aftertreating unit comprises suitable radiation sources for irradiating the flexographic printing plate with UV-A and/or UV-C light.

The delivery unit (G) is used for delivering the completed flexographic printing plate. At its most simple, this unit may comprise a simple delivery means, from which the flexographic printing plates are taken manually. For example, the flexographic printing plates may be run out on a conveying belt from the aftertreating unit (F). The delivery unit (D) may alternatively comprise a magazine which is able to hold a relatively large quantity of completed flexographic printing elements.

The transport units (H) join at least the units (B) to (E), but as and when necessary also join all units (A) to (G), to one another, and provide for the transport of the flexographic printing elements or plates from one unit to the next. It is conceivable for the flexographic printing elements or plates to be run through the entire apparatus of the invention on a single transport means. The transport means may be, for example, a conveyor belt, onto which a flexographic printing element is placed and is held on the belt by means of suitable holding means, such as pins, for example, and conveyed. Alternatively, the flexographic printing element may also be transported using what is called a transport strip. A transport strip is a rigid holding means on which the flexographic printing element is fixed for transport. This fixing may be implemented, for example, by first punching holes into the flexographic printing element, these holes holding the flexographic printing element in position with the aid of metal pins on the transport strip. Also possible is the use of a clamping mechanism on the transport strip. The transport strip is transported through the entire apparatus of the invention, taking the flexographic printing element with it. The transport strip may advantageously be transported through the entire apparatus of the invention by means of driven threaded rods if the outer sides of the transport strip carry contours that form a positive lock with the threaded rod.

The invention is illustrated by the examples which follow.

EXAMPLES

Flexographic Printing Plates Used

The flexographic printing plates used in the examples below were commercially available plates, called digital flexographic printing plates, of the Nyloflex® brand (Flint Group), which are marketed under the product name ACE 114 D and also FAC 470 D.

Digital flexographic printing plates comprise, disposed one atop another, at least
a) a dimensionally stable support (in the present case, a PET film)
b) a light-sensitive elastomeric layer which can be crosslinked imagewise by means of actinic radiation
c) a mask layer which is substantially opaque to UV light, it also being possible for further interlayers to be employed, such as an adhesion-promoting layer between a) and b), for example.

Preliminary Exposure of the Flexographic Printing Plates

Flexographic printing plates having UV-transparent supports, with a thickness of at least 1 mm, are typically subjected to preliminary exposure over their full area, from the reverse side, in order to generate a two-dimensional polymerized region which adjusts the relief depth of the nonimage regions to a desired degree. As a result, fine, isolated positive elements are more effectively anchored and therefore also become more stable in the printing operation. Flexographic printing plates with a thickness of 1.14 mm are typically subjected to preliminary reverse-side exposure with UV light until the relief depth in the nonimage regions is 0.5 to 0.7 mm.

Prior to the step of mask imaging, the flexographic printing plates used in the examples were preexposed from the reverse side with UV light, for the time indicated in table 1, to set a relief depth of approximately 0.7 mm.

Digital Imaging of the Flexographic Printing Plates

For all of the tests identified in the examples, the digital flexographic printing plates used were imaged with a test pattern which contains different test elements, including a plurality of halftone values in different screen widths and fine lines, text, negative dots, and also negative lines and script in variable dimensions.

Imaging of the digital mask was performed using a "nano" ablation laser system from Flexolaser GmbH, the mask resolution used being 2540 dpi.

Development of Flexographic Printing Plates

Solvent-based development of the imagewisely exposed flexographic printing plates was carried out at the washing rate indicated and with the brush setting recommended for the particular product type, with the aid of a Nyloflex® F III washer. The washing agent used was Nylosolv® A.

After the washing operation, the plates, which still contain solvent, were dried in accordance with the product-specific recommendations at 60-65° C. and then re-exposed in the re-exposure unit of a Nyloflex® F III exposure device, using UVA and UVC light. Re-exposure serves first to react those remnants of monomer and photoinitiator that are still reactive, and secondly it has the effect of making the plate surface more tack-free.

Exposure of Flexographic Printing Plates Using UV Tubes

Flexographic printing plates were exposed using UV tubes in the main exposure unit of a Nyloflex® F III exposure device, with the UV/A radiation power at the level of the plate surface, as determined using a UVA meter from KUhnast, being on average 15 mW/cm².

Exposure of the Flexographic Printing Plates Using UV-LED Radiation

The UV-LED unit used was a high-performance array composed of 8 square UV-LED modules in a coolable metal housing. Each of these UV-LED modules consisted of 5×5 individual diode elements, arranged together in a square field of approximately 8×8 mm, thus giving the overall array a UV emission area of around 75×8 mm. The UV-LEDs used possessed an emission maximum of 365 nm, and were operated at a very constant power level by means of water cooling and an associated control device. UV-LED units of this kind are available for example from Dr. Honle AG (Grafelfing, Germany) under the name "UV-LED Powerline".

Examples A1-A5

First of all, as elucidated above, an IR laser was used to write a test pattern into the mask layer of a Nyloflex® ACE 114 D flexographic printing plate which had been preexposed from its reverse. Owing to the remaining mask layer, the nonimage regions remain UV-opaque, while the removal of the mask in the image regions enables the photopolymerizable relief layer to be cured by means of actinic radiation.

In a first exposure step, the flexographic printing plate prepared in this way was first transported at an even rate, by means of a transport means, beneath a UV-LED unit of the type described, and in this way, on its front side, the plate was exposed to the radiation from the UV-LED unit; the parameters of exposure rate (transport speed of the plate beneath the UV-LED unit), distance between plate surface and beam source, and the UV dose applied using UV-LED can be found in table 1.

In a second exposure step, the UV-LED-exposed printing plate was subsequently further exposed with UV tubes in a Nyloflex® F III exposure system, for the period of time indicated in table 1. The sum total of the UV dose from both exposure steps is also listed in table 1.

Lastly, as described above, the exposed flexographic printing plate, in accordance with the product-specific recommended processing parameters, was washed in a solvent-based developing step, dried, and re-exposed.

Example A6

First of all, as elucidated above, an IR laser was used to write a test pattern into the mask layer of a Nyloflex® FAC 470 D (thickness without top sheet: 4.7 mm) flexographic printing plate which had been preexposed from its reverse. Owing to the remaining mask layer, the nonimage regions remain UV-opaque, while the removal of the mask in the image regions enables the photopolymerizable relief layer to be cured by means of actinic radiation.

In a first exposure step, the flexographic printing plate prepared in this way was first transported at an even rate, by means of a transport means, beneath a UV-LED unit of the type described, and in this way, on its front side, the plate was exposed to the radiation from the UV-LED unit; the parameters of exposure rate (transport speed of the plate beneath the UV-LED unit), distance between plate surface and beam source, and the UV dose applied using UV-LED can be found in table 1.

In a second exposure step, the UV-LED-exposed printing plate was subsequently further exposed with UV tubes in a Nyloflex® F III exposure system, for the period of time indicated in table 1. The sum total of the UV dose from both exposure steps is also listed in table 1.

Lastly, as described above, the exposed flexographic printing plate, in accordance with the product-specific recommended processing parameters, was washed in a solvent-based developing step, dried, and re-exposed.

Example A7

First of all a film element was prepared, comprising the following layers atop one another:
d) a PET film 125 µm thick;
c2) a digitally imagable mask layer approximately 3 µm thick, comprising a polymeric binder and carbon black (identical to the mask layer used in commercially available printing plates of the Nyloflex® brand);
c1) a rough, UV-transparent layer comprising a polymeric binder and porous silica particles.

The rough, UV-transparent layer was obtained as follows:
First of all a solution of 7 parts by weight of Macromelt 6900 was prepared in 90 parts by weight of a solvent mixture (45 parts n-propanol, 45 parts toluene, 10 parts benzyl alcohol) with heating to 50° C. Added subsequently to this solution were 3 parts by weight of a porous silica gel (Syloid® ED-5 from Grace & Co., average particle diameter 8.4-10.2 µm, pore volume 1.8 ml/g). The particulate silica gel was dispersed in the polymer solution for a period of 20 minutes by means of an ULTRA-TURRAX® T 50 disperser at 8000 rpm. The resultant dispersion was applied to a digital mask layer which had a thickness of approximately 3 µm and was located on a PET film 125 µm thick. The digital mask layer consisted of about 65% of Macromelt 6900 and 35% of a finely divided carbon black. In this way a film element was produced that had the above-described layer sequence of PET film, mask layer, and rough substrate layer. The application rate of the rough substrate layer was approximately 5 g/m².

In the course of the standard production process of the Nyloflex® ACE 170 printing plate, the film element described was supplied by means of extrusion via the upper calender roll, to give a flexographic printing element which comprised the following layers arranged one atop another:
a) a dimensionally stable PET support film with a thickness of 125 µm and a thin adhesion layer;
b) a photopolymerizable elastomeric layer;
c1) a rough, UV-transparent layer comprising a polymeric binder and porous silica particles, and having an application weight of approximately 5 g/m²;
c2) a digitally imagable mask layer approximately 3 µm thick and comprising a polymeric binder and carbon black (identical to the mask layer used in commercially available printing plates of the Nyloflex® brand);
d) a PET protective film 125 µm thick.

First of all, as elucidated above, an IR laser was used to write a test pattern into the mask layer of the flexographic printing element thus produced which had been preexposed from its reverse. Owing to the remaining mask layer, the nonimage regions remain UV-opaque, while the removal of the mask in the image regions enables the photopolymerizable relief layer to be cured by means of actinic radiation.

In a first exposure step, the flexographic printing plate prepared in this way was first transported at an even rate, by means of a transport means, beneath a UV-LED unit of the type described, and in this way, on its front side, the plate was exposed to the radiation from the UV-LED unit. The exposure rate was 150 mm/min for a distance between plate surface and beam source of 5 mm. The UV dose applied by means of UV-LED was 1.8 J/cm$^2$.

In a second exposure step, the UV-LED-exposed printing plate was subsequently further exposed with UV tubes in a Nyloflex® F III exposure system, for 6 minutes. The sum total of the UV dose from both exposure steps was therefore 7.2 J/cm$^2$.

Lastly, the exposed flexographic printing plate, at a washing rate of 270 mm/min, was washed in a solvent-based developing step, dried, and re-exposed.

Before and after implementation of the method of the invention, photographs were taken of the surface of the flexographic printing element using a recording microscope (from M-Service). The photographs are reproduced in FIGS. 1 and 2. For comparison, a flexographic printing element of this kind, after digital imaging, was exposed for 15 minutes with conventional UV/A tubes (15 mW/cm$^2$) in an ambient atmosphere, and otherwise developed with identical parameters. The surface of this conventionally processed flexographic printing element is shown in picture 3.

Figure 2:
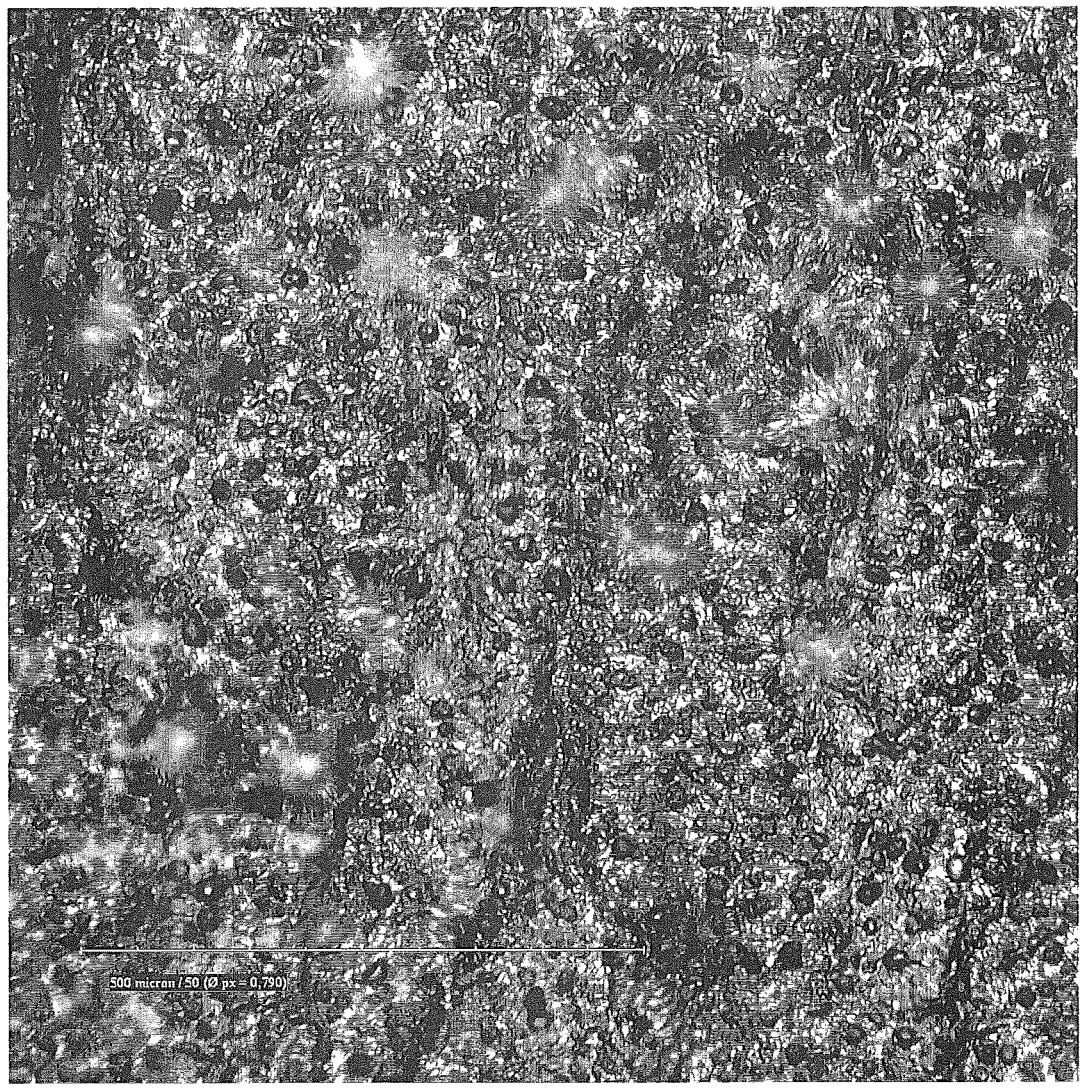
FIG. 2 is a photograph of the surface of a flexographic printing element with rough-surfaced, relief-forming layer after ablation of the digitally imagable layer, and after inventive exposure and development.
Figure 3:
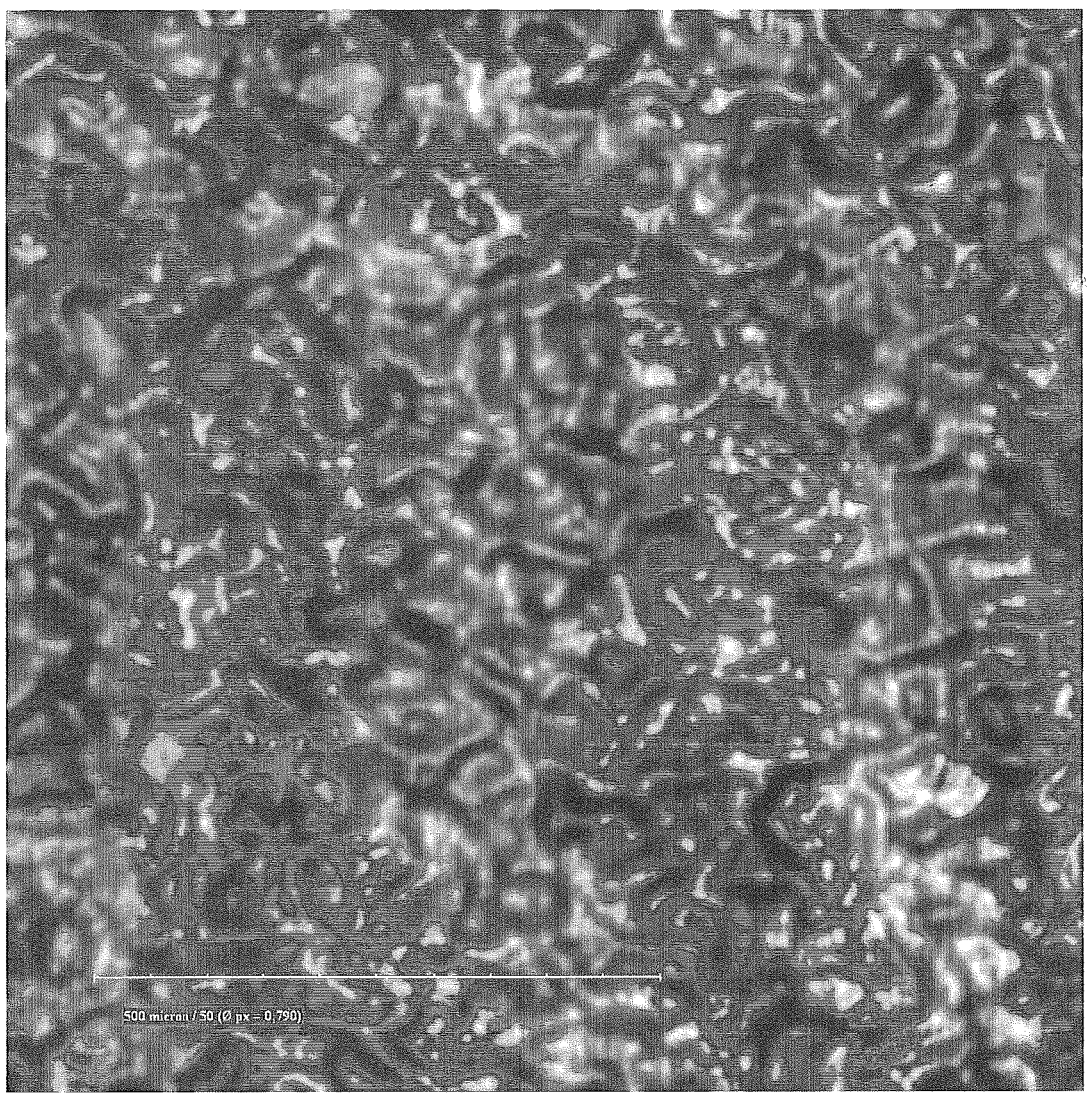
FIG. 3 is a photograph of the surface of a flexographic printing element with rough-surfaced, relief-forming layer, after ablation of the digitally imagable layer, after conventional exposure exclusively with a UVA tube, and after development.

Accordingly,

FIG. 1 shows a photograph of the surface of the flexographic printing element with rough-surfaced, relief-forming layer, after ablation of the digitally imagable layer, but before exposure and development;

FIG. 2 shows a photograph of the surface of the flexographic printing element with rough-surfaced, relief-forming layer after ablation of the digitally imagable layer, and after inventive exposure and development;

FIG. 3 shows a photograph of the surface of the flexographic printing element with rough-surfaced, relief-forming layer, after ablation of the digitally imagable layer, after conventional exposure exclusively with a UVA tube, and after development.

From the photographs it can be seen that the roughness of the substrate surface after the method of the invention has been performed can be reproduced on the printing surface, whereas in the case of exposure by means of conventional UV/A tubes, the inhibitory effect of the oxygen means that the roughness is not transferred to the surface of the printing element.

Comparative Example B1

First of all, as elucidated above, an IR laser was used to write a test pattern into the mask layer of a Nyloflex® ACE 114 D flexographic printing plate which had been preexposed from its reverse. Owing to the remaining mask layer, the nonimage regions remain UV-opaque, while the removal of the mask in the image regions enables the photopolymerizable relief layer to be cured by means of actinic radiation.

The flexographic printing plate thus prepared was exposed for the time indicated in table 1 exclusively with UV tubes in a Nyloflex® F III exposure system, from the front side.

Lastly, as described above, the exposed flexographic printing plate, in accordance with the product-specific recommended processing parameters, was washed in a solvent-based developing step, dried, and re-exposed.

Comparative Example B2

First of all, as elucidated above, an IR laser was used to write a test pattern into the mask layer of a Nyloflex® ACE 114 D flexographic printing plate which had been preexposed from its reverse. Owing to the remaining mask layer, the nonimage regions remain UV-opaque, while the removal of the mask in the image regions enables the photopolymerizable relief layer to be cured by means of actinic radiation.

In a single exposure step, the flexographic printing plate prepared in this way was transported at an even rate, by means of a transport means, beneath two UV-LED units in series, and in this way, on its front side, the plate was exposed to the radiation from the two UV-LED units; the parameters of exposure rate (transport speed of the plate beneath the UV-LED units), distance between plate surface and beam source, and the UV dose applied using UV-LED can be found in table 1.

Lastly, as described above, the exposed flexographic printing plate, in accordance with the product-specific recommended processing parameters, was washed in a solvent-based developing step, dried, and re-exposed.

Comparative Example B3

First of all, as elucidated above, an IR laser was used to write a test pattern into the mask layer of a Nyloflex® ACE 114 D flexographic printing plate which had been preexposed from its reverse. Owing to the remaining mask layer, the nonimage regions remain UV-opaque, while the removal of the mask in the image regions enables the photopolymerizable relief layer to be cured by means of actinic radiation.

The flexographic printing plate thus prepared was exposed in a first step, for the time indicated in table 1, using UV tubes, in a Nyloflex® F III exposure system, from the front side.

In a further step, the printing plate was subsequently transported by means of a transport device at a uniform rate beneath the above-described UV-LED unit, and was therefore exposed from the front side with the radiation from the UV-LED unit; the parameters of exposure rate (transport speed of the plate beneath the UV-LED unit), distance between plate surface and beam source, and the UV dose applied using UV-LED can be found in table 1. The sum total of the UV dose from all exposure steps is also listed in table 1.

Lastly, as described above, the exposed flexographic printing plate, in accordance with the product-specific recommended processing parameters, was washed in a solvent-based developing step, dried, and re-exposed.

Assessment of the Test Elements
a) Depth of 400 µm Negative Dot

The depth of the 400 µm negative dot is a measure of the differentiation between image and nonimage regions in the print. While it is desirable for the printing image elements to be stably formed, the intermediate depth in the nonimage regions ought to be as high as possible, so that even in a relatively long printing procedure the nonimage regions remain open and do not lead to defects in the printed image.
b) Minimum Dimension of Stably Formed Positive Elements (Positive Dot, Positive Line, Screen)

The smaller the dimension of the first stably formed positive elements, the better the resolution of the printing plate and the finer the details that can be reproduced in the printing procedure. Smaller stable halftone values, moreover, increase the tonal value range and hence the contrast, especially in the case of tonal value progressions and screened images.

c) 60 μm Grid

The 60 μm grid is a test element which represents crossed fine positive lines in the pattern. In flexographic printing, such elements are critical, since because of the small width of the element they are difficult to anchor stably and at the same time, owing to their geometry, are susceptible to the swelling effect of the washing agent.

If the grid is not fully formed and/or if the grid, though formed as such, nevertheless exhibits wavy deformation after redrying, the grid is assessed as "−".

If the grid has only minimal waviness (only visible using a microscope), but is otherwise stably formed, then the grid is assessed as "o".

If the grid, although formed with stable anchoring, has a line width at the surface which is smaller than specified in the data, the grid is assessed as "(+)".

A grid with complete, stable formation and a width which corresponds essentially to the width of the element in the pattern data is assessed as "+".

d) Tonal Value of the 15% Raster Field at 146 lpi, Measured on the Plate

Rasters are used for the reproduction of halftones—that is, for the representation of pattern regions which do not correspond 100% to one of the primary colors used in the printing procedure. In this way, mixed colors with different lightnesses can be produced.

In the present case, a so-called "autotypical raster" was used, i.e., the screened area is divided into a fixed number of raster cells. Lightness and perceived color are varied principally through the size of a dot in such a cell (the amplitude).

The raster field used possesses a coverage of 15% in the pattern data. The tonal value measured for this field at the plate surface is a measure of the copying accuracy. If the value measured on the plate is smaller than in the data, then tonal value reduction is said to have occurred. This may on the one hand be desirable, in order to compensate, for example, for the increase in tonal value in the actual printing procedure; on the other hand, beneath a certain tonal value, halftone dots are no longer stably anchored and will no longer be formed. As a result, gray gradations are lost, and the tonal value range in the print is lower. The effect of tonal value reduction is known in the context of the exposure of digital flexographic printing plates with UV tubes in accordance with the prior art. The polymerization-inhibiting effect of the oxygen during exposure disrupts the polymerization of the halftone dots, and so the halftone dots on the plate are smaller than specified in the data. However, the extent of this effect is dependent on the intensity of the UV radiation and may therefore entail fluctuating tonal values in the event of changes in the intensity of the UV tubes used.

Ideally, halftone dots on the plate possess a coverage approximately the same as that in the parent data, but also possess sufficient depressions between the individual halftone dots to prevent ink being laid down in the vicinity of the printing surface in the printing procedure.

Interpretation of the Test Results

As can be seen from examples A1-A5 and B2, fine positive elements such as dots, lines, and screens are reproduced well on exposure with the intensive UVA radiation from UV-LEDs. A particularly surprising finding here as well was that in spite of the high UV intensity there was no undesirably high heating of the plate >50° C., and so the dimensional stability of a PET film support is unaffected, despite the fact that a high UV intensity by itself might have suggested higher temperatures from the heat of polymerization occurring in the crosslinking procedure.

From the halftone values measured on the plate, moreover, it can be inferred that the tonal value copied onto the plate when using UV-LED radiation, at around 13%, comes very close to the parent data tonal value of 15% at 146 lpi. This means that exposure takes place with high copying accuracy. At the same time, when using UV-LED radiation, the halftone dots at the surface have undergone virtually no rounding, thereby ensuring a more stable and more reproducible printing procedure, since highly rounded fine halftone dots may give rise to greatly differing increases in tonal value, depending on the setting in the printing procedure. The slight remaining reduction in tonal value on copying onto the plate, however, is entirely desirable, since there is always a slight increase in tonal value as a result of the print setting in the printing procedure, and so a slight reduction in the elements helps to compensate this increase in the print, and so to enhance the contrast range of the printed image.

For the formation of certain critical fine elements such as a grid of lines 60 μm wide, however, a very high dose of UV-LED radiation is required. In comparative example B2, around 4.4 J/cm$^2$ of pure UV-LED power are still not enough to result in adequately stable formation of such a grid. A UV-LED dose of this level, moreover, requires a large number of LED elements in order to obtain acceptable exposure times. Particularly in the case of automated continuous systems (e.g., coupled with a downstream washing unit), the ACE 114 D plate used in the examples, with a washing rate of 300 mm/min, would necessitate more than 5 UV-LED strips in series, which would represent a massive cost and hence render the exposure operation uneconomic.

From examples A2-A5, however, it can be readily inferred that, provided there is a certain minimum dose of UV-LED radiation, even a more cost-effective combination of UV-LED radiation and a downstream final exposure with UV radiation from a conventional beam source facilitates the desired copying accuracy, Specifically at a UV-LED dose of >1 J/cm$^2$, stable, copying-accurate elements are produced on the plate, through suppression of the oxygen inhibition that occurs on exposure with UV beam sources of relatively low intensity. If the UV-LED dose is too low, in contrast, there may be instances of fragmentation in fine elements, which in the printing procedure leads to fluctuations in the printed image and to defective prints. Example A1 illustrates this, since the tonal values measured on the plate at 15% data and 146 lpi still fluctuate, a fact attributable to instances of fragmentation in the halftone dots. Here, the initial UV-LED dose, at <1 J/cm$^2$, is still too low.

Example A6 illustrates the fact that even with relatively thick flexographic printing elements, which are used, for example, for printing corrugated card or other rough or uneven substrates, an initial exposure with UV-LEDs followed by a low-energy exposure with UV/A tubes, allows copying-accurate reproduction of very finely resolved data. The reproduction of a 15% tonal value with a screen ruling of 146 lpi yields a tonal value of only 2-3% in the case of conventional exposure of the same flexographic printing element with UV/A tubes, on the plate, whereas the tonal value on the plate in the case of implementation of the method of the invention, at 10.6%, produces a value which is much closer to the ideal value. Furthermore, the halftone dots when the method of the invention is implemented possess defined dot surfaces which are substantially planar.

Conversely, reversing the sequence—that is, exposure first with a customary UV beam source of relatively low intensity (UVA tubes), and subsequent exposure with high-energy UV-LED radiation—does not produce the desired effect (comparative example B3), since oxygen inhibition of polymerization, once it has occurred, can no longer be reversed by subsequent exposure with high-energy UV radiation—in other words, reproduction in that case is no longer copying-precise.

step (b-2), exposure takes place with actinic light with an intensity of <100 mW/cm² from a UV radiation source other than UV-LEDs.

2. The method as claimed in claim 1, characterized in that the radiation source used in step (b-2) is a UV tube or a UV lamp.

3. The method as claimed in claim 1, characterized in that the UV-LEDs used in step (b-1) have an emission maximum in the wavelength range of 350-405 nm.

4. The method as claimed in claim 3 wherein the emission maximum of the UV-LEDs used in step (b-1) is at 350 nm.

| Example | | A1 | A2 | A3 | A4 | A5 | A6 | B1 | B2 | B3 |
|---|---|---|---|---|---|---|---|---|---|---|
| Plate type | | ACE 114 D | ACE 114 D | ACE 114 D | ACE 114 D | ACE 470 D | FAC 114 D | ACEa 114 D | ACE 114 D | ACE 114 D |
| Plate processing | | | | | | | | | | |
| Reverse-face prelim exposure time | sec | 19 | 19 | 19 | 19 | 19 | 115 | 19 | 19 | 19 |
| UV beam source | | UV-LED 365 | UV-LED 365 | UV-LED 365 | UV-LED 365 | UV-LED 365 | UV-LED 365 | UV-tubes | UV-LED 365 | UV-LED 365 |
| Number of UV-LED units in sequence | mm | 1 | 1 | 1 | 1 | 1 | 1 | | 2 | 1 |
| First/last beam source time | sec | 3 | 6 | 6 | 6 | 6 | 11 | | 62 | 6 |
| Preliminary exposure UVA tubes | min | | | | | | | 15 | | 6 |
| UV intensity UV-LED | mW/cm² | 300.0 | 300.0 | 300.0 | 300.0 | 300.0 | 300.0 | — | 300.0 | 300.0 |
| Beam source/plate distance | mm | 5 | 5 | 5 | 5 | 5 | 5 | — | 5 | 5 |
| Exposure rate | mm/min | 300 | 150 | 150 | 150 | 150 | 80 | — | 120 | 150 |
| UV dose LED | J/cm² | 0.9 | 1.8 | 1.8 | 1.8 | 1.8 | 3.3 | | 4.4 | 1.8 |
| Secondary exposure UVA tubes | min | 6 | 2 | 4 | 6 | 8 | 6 | | | |
| UV dose LED & tubes | J/cm² | 6.3 | 3.6 | 5.4 | 7.2 | 9.0 | 8.7 | 13.5 | 4.4 | 7.2 |
| Washing rate | mm/min | 270 | 270 | 270 | 270 | 270 | 80 | 270 | 270 | 270 |
| Exposure properties | | | | | | | | | | |
| Depth of 400 μm negative dot | μm | 180 | 190 | 185 | 185 | 170 | 135 | 170 | 150 | 180 |
| min. stable positive dot | μm | 300 | 200 | 200 | 200 | 200 | 300 | 200 | 200 | 200 |
| min. stable positive line | μm | 80 | 120 | 80 | 40 | 40 | 100 | 20 | 80 | 60 |
| 60 μm grid | | ○ | ○ | ○ | + | + | ○ | (+) | — | (+) |
| min. stable screen @123 lpi | % | 5 | 5 | 4 | 3 | 4 | 7 | 5 | 3 | 5 |
| min. stable screen @146 lpi | % | 5 | 6 | 5 | 4 | 5 | 8 | 6 | 3 | 6 |
| Halftone value 15% data @146 lpi | % | 8-10 | 13.2 | 13.0 | 12.7 | 12.9 | 10.6 | 6.6 | 13.4 | 6.2 |

The invention claimed is:

1. A method for producing flexographic printing plates, using as starting material a photopolymerizable flexographic printing element which at least comprises, arranged one atop another, a dimensionally stable support, and at least one photopolymerizable, relief-forming layer, at least comprising an elastomeric binder, an ethylenically unsaturated compound, and a photoinitiator, a digitally imagable layer, and the method comprises at least the following steps:

(a) producing a mask by imaging the digitally imagable layer, (b) exposing the photopolymerizable, relief-forming layer through the mask with actinic light, and photopolymerizing the image regions of the layer, and (c) developing the photopolymerized layer by washing out the unphotopolymerized regions of the relief-forming layer with an organic solvent, or by thermal development, characterized in that step (b) comprises two exposure steps (b-1) and (b-2), where in a first step (b-1) exposure with actinic light takes place with an intensity, at a surface of the flexographic printing element, of >100 mW/cm² from a plurality of UV-LEDs and subsequently, in a second 5. The method as claimed in claim 3 wherein the emission maximum of the UV-LEDs used in step (b-1) is at 365 nm.

6. The method as claimed in claim 3 wherein the emission maximum of the UV-LEDs used in step (b-1) is at 375 nm.

7. The method as claimed in claim 3 wherein the emission maximum of the UV-LEDs used in step (b-1) is at 385 nm.

8. The method as claimed in claim 3 wherein the emission maximum of the UV-LEDs used in step (b-1) is at 395 nm.

9. The method as claimed in claim 3 wherein the emission maximum of the UV-LEDs used in step (b-1) is at 405 nm.

10. The method as claimed in claim 1, characterized in that the intensity in the first exposure step (b-1) is ≥150 mW/cm².

11. The method as claimed in claim 1, characterized in that the intensity in the second exposure step (b-2) is ≤50 mW/cm².

12. The method as claimed in claim 1, characterized in that the radiation dose in the first exposure step (b-1) is 1 to 4 J/cm² and in the second exposure step (b-2) is 2 to 8 J/cm².

13. The method as claimed in claim 1, characterized in that the digitally imagable layer is a laser-ablatable layer.

14. The method as claimed in claim 1, wherein between the photopolymerizable, relief-forming layer and the digitally imagable layer there is a rough, UV-transparent layer, at least comprising a particulate substance having an average particle diameter of 0.5-50 μm.

15. The method as claimed in claim 1, characterized in that the printing element includes a rough, UV-transparent layer which comprises a polymeric binder or a wax.

16. The method as claimed in claim 1 including a rough, UV-transparent layer, at least comprising a particulate substance, between the relief-forming layer and the digitally imagable layer.

\* \* \* \* \*